(12) United States Patent
McClure et al.

(10) Patent No.: US 7,666,494 B2
(45) Date of Patent: *Feb. 23, 2010

(54) MICROPOROUS ARTICLE HAVING METALLIC NANOPARTICLE COATING

(75) Inventors: Donald J. McClure, Shoreview, MN (US); Mario A. Perez, Burnsville, MN (US)

(73) Assignee: 3M Innovative Properties Company, St. Paul, MN (US)

(*) Notice: Subject to any disclaimer, the term of this patent is extended or adjusted under 35 U.S.C. 154(b) by 694 days.

This patent is subject to a terminal disclaimer.

(21) Appl. No.: 11/121,479

(22) Filed: May 4, 2005

(65) Prior Publication Data

US 2006/0251874 A1 Nov. 9, 2006

(51) Int. Cl.
*B41M 5/00* (2006.01)

(52) U.S. Cl. .................. 428/195.1; 428/156; 438/700; 977/890

(58) Field of Classification Search .............. 428/195.1, 428/156; 438/700; 977/890
See application file for complete search history.

(56) References Cited

U.S. PATENT DOCUMENTS

| | | | |
|---|---|---|---|
| 4,247,498 A | 1/1981 | Castro | |
| 4,539,256 A | 9/1985 | Shipman | |
| 4,726,989 A | 2/1988 | Mrozinski | |
| 4,849,311 A | 7/1989 | Itoh et al. | |
| 4,863,792 A | 9/1989 | Mrozinski | |
| 4,867,881 A * | 9/1989 | Kinzer | 210/490 |
| 4,871,790 A | 10/1989 | Lamanna et al. | |
| 5,026,599 A | 6/1991 | Koskenmaki | |
| 5,130,342 A | 7/1992 | McAllister et al. | |
| 5,238,623 A | 8/1993 | Mrozinski | |
| 5,366,140 A | 11/1994 | Koskenmaki et al. | |
| 5,750,641 A | 5/1998 | Ezzell et al. | |
| 5,774,619 A | 6/1998 | Bruesselbach | |
| 5,922,403 A * | 7/1999 | Tecle | 427/212 |
| 6,042,959 A * | 3/2000 | Debe et al. | 429/33 |
| 6,096,213 A | 8/2000 | Radovanovic et al. | |
| 6,383,612 B1 * | 5/2002 | Waller et al. | 428/32.17 |
| 6,411,748 B1 | 6/2002 | Foltzer | |
| 6,425,993 B1 * | 7/2002 | Debe et al. | 204/296 |
| 6,514,599 B1 * | 2/2003 | Ali et al. | 428/195.1 |
| 6,537,650 B1 * | 3/2003 | Waller et al. | 428/195.1 |
| 6,576,354 B2 * | 6/2003 | Tsukatani et al. | 428/702 |

(Continued)

FOREIGN PATENT DOCUMENTS

EP 1 130 051 A2 9/2001

(Continued)

OTHER PUBLICATIONS

Lu et al., "High-Density Silver Nanoparticle Film With Temperature-Controllable Interparticle Spacing for a Tunable Surface Enhanced Raman Scattering Substrate", Nano Letters, (2005), pp. 5-9, vol. 5, No. 1, American Chemical Society.

(Continued)

*Primary Examiner*—Bruce H. Hess
*Assistant Examiner*—Tamra L. Dicus
(74) *Attorney, Agent, or Firm*—Kent S. Kokko

(57) ABSTRACT

A metallic nanoparticle coated microporous substrate, the process for preparing the same and uses thereof are described.

10 Claims, 2 Drawing Sheets

U.S. PATENT DOCUMENTS

| | | | |
|---|---|---|---|
| 6,592,945 B2 | 7/2003 | Suzuki et al. | |
| 6,642,295 B2 | 11/2003 | Border et al. | |
| 6,773,926 B1 | 8/2004 | Freund et al. | |
| 6,805,940 B2* | 10/2004 | Koskenmaki et al. | 428/138 |
| 6,816,125 B2* | 11/2004 | Kuhns et al. | 343/880 |
| 6,838,486 B2 | 1/2005 | Ryang | |
| 6,875,465 B2 | 4/2005 | Bishop et al. | |
| 7,002,697 B2 | 2/2006 | Domash et al. | |
| 7,030,989 B2 | 4/2006 | Yager et al. | |
| 7,237,330 B2* | 7/2007 | Koskenmaki et al. | 29/825 |
| 7,259,100 B2* | 8/2007 | Zurcher et al. | 438/700 |
| 2001/0036546 A1 | 11/2001 | Kaytor et al. | |
| 2002/0142306 A1 | 10/2002 | Coleman et al. | |
| 2003/0165680 A1 | 9/2003 | Brady et al. | |
| 2003/0170687 A1 | 9/2003 | Chilkoti et al. | |
| 2003/0203222 A1 | 10/2003 | Phillips et al. | |
| 2003/0228459 A1 | 12/2003 | Mrozinski et al. | |
| 2004/0131799 A1 | 7/2004 | Arsenault et al. | |
| 2005/0136231 A1 | 6/2005 | Voss-Kehl et al. | |
| 2005/0259300 A1* | 11/2005 | Burberry et al. | 359/13 |

FOREIGN PATENT DOCUMENTS

| | | |
|---|---|---|
| EP | 1 300 435 | 4/2003 |
| EP | 1 300 435 A1 | 4/2003 |
| WO | WO 98/10289 A1 | 3/1998 |
| WO | WO 99/05315 A2 | 2/1999 |
| WO | WO 00/06495 | 2/2000 |
| WO | WO 00/34033 A1 | 6/2000 |
| WO | WO 03/093809 A1 | 11/2003 |
| WO | WO 2005/005526 A2 | 1/2005 |
| WO | WO 2005/008243 | 1/2005 |
| WO | WO 2005/008243 A1 | 1/2005 |

OTHER PUBLICATIONS

Biswas et al., "Polymer-Metal Optical Nanocomposites With Tunable Particle Plasmon Resonance Prepared by Vapor Phase Co-Deposition", Materials Letters, (2004), pp. 1530-1534, vol. 58, Elsevier B. V.

Zheng et al., "Optical Properties of Silver-Dispersed PVP Thin Film", Materials Research Bulletin, (2001), pp. 853-859, vol. 36, Elsevier Science Ltd.

Akamatsu et al., "In Situ Spectroscopic and Microscopic Study on Dispersion of Ag Nanoparticles in Polymer Thin Films", Journal of Physical Chemistry B, (2000), pp. 10168-10173, vol. 104, American Chemical Society.

Alfrey et al, "Physical Optics of Iridescent Multilayered Plastic Films", Polymer Engineering and Science, (Nov. 1969), pp. 400-404, vol. 9, No. 6, Society of Plastics Engineers, Inc.

Andres et al., "Self-Assembly of a Two-Dimensional Superlattice of Molecularly Linked Metal Clusters", Science, (Sep. 1996), pp. 1690-1693, vol. 273, American Association for the Advancement of Science, Washington, DC.

Averitt et al., "Linear Optical Properties of Gold Nanoshells", Journal of Optical Society of America B, (Oct. 1999), pp. 1824-1832, vol. 16, No. 10, Optical Society of America.

Averitt et al., "Ultrafast Optical Properties of Gold Nanoshells", Journal of Optical Society of America B, (Oct. 1999), pp. 1814-1823, vol. 16, No. 10, Optical Society of America.

Blackborow et al., "Metal Vapour Synthesis in Organometallic Chemistry", (1979), Springer-Verlag, Berlin Heidelberg, New York.

Bohren, "How Can a Particle Absorb More Than the Light Incident on It?", American Journal of Physics, (Apr. 1983), pp. 323-327, vol. 51, No. 4, American Institute of Physics, New York, NY.

Carlotto, "The Chemistry of Thin Film Color", Society of Vacuum Coaters, (Apr. 15-20, 2000), pp. 58-60, 43rd Annual Technical Conference Proceedings.

Chang et al., "The Shape Transition of Gold Nanorods", Langmuir, (1999), pp. 701-709, vol. 15, No. 3, American Chemical Society.

Collier et al., "Reversible Tuning of Silver Quantum Dot Monolayers Through the Metal-Insulator Transition", Science, (Sep. 1997), pp. 1978-1981, vol. 277.

Doyle, "Absorption of Light by Colloids in Alkali Halide Crystals", Physical Review, (Aug. 1958), pp. 1067-1072, vol. 111, No. 4.

Foss et al., "Template-Synthesized Nanoscopic Gold Particles: Optical Spectra and the Effects of Particle Size and Shape", Journal of Physical Chemistry, (1994), pp. 2963-2971, vol. 98, No. 11, American Chemical Society.

Granqvist et al., "Optical Properties of Ultrafine Gold Particles", Physical Review B, (Oct. 1977), pp. 3513-3534, vol. 16, No. 8.

Hache et al., "The Optical Kerr Effect in Small Metal Particles and Metal Colloids: The Case of Gold", Applied Physics A Solids and Surfaces, (Dec. 1988), pp. 347-357, vol. A 47, No. 4.

Hale et al., "Enhancing the Active Lifetime of Luminescent Semiconducting Polymers via Doping with Metal Nanoshells", Applied Physics Letters, (Mar. 2001), pp. 1502-1504, vol. 78, No. 11, American Institute of Physics.

Hessel et al., "A New Theory of Wood's Anomalies on Optical Gratings", Applied Optics, (Oct. 1965), pp. 1275-1297, vol. 4, No. 10.

Holland, "Vacuum Deposition of Thin Films", (1956), John Wiley & Sons Inc., NY.

Jain et al., "Optical Properties of Silver Colloidal Centers in KCL Crystals", Journal of Physics and Chemistry of Solids, (1974), pp. 1231-1236, vol. 35, Pergamon Press.

Johnson et al., "Optical Constants of the Noble Metals", Physical Review B, (Dec. 1972), pp. 4370-4379, vol. 6, No. 12.

Kerker, "The Scattering of Light", (1969), pp. 198-217, Academic Press, Inc., New York.

Kreibig, "Optical Absorption of Small Metallic Particles", Surface Science, (1985), pp. 678-700, vol. 156, Elsevier Science Publishers B. V., North-Holland, Amsterdam.

Lazarides et al., "DNA-Linked Metal Nanosphere Materials: Structural Basis for the Optical Properties", Journal of Physical Chemistry B, (2000), pp. 460-467, vol. 104, No. 3, American Chemical Society.

Liao et al., "Surface-Enhanced Raman Scattering on Gold and Aluminum Particle Arrays", Optics Letters, (Oct. 1982), pp. 483-485, vol. 7, No. 10, Optical Society of America.

Montali et al., "Polarizing Energy Transfer in Photoluminescent Materials for Display Applications", Nature, (Mar. 1998), pp. 261-264, vol. 392, No. 6673, Macmillan Magazines Ltd.

Oldenburg et al., "Light Scattering from Dipole and Quadrupole Nanoshell Antennas", Applied Physics Letters, (Aug. 1999), pp. 1063-1065, vol. 75, No. 8, American Institute of Physics.

Palik, "Handbook of Optical Constants of Solids III", Institute for Physical Science and Technology, (1998), Academic Press, San Diego, CA.

Perenboom et al., "Electronic Properties of Small Metallic Particles", Physics Reports (Review Section of Physics Letters), (1981), pp. 173-292, vol. 78, No. 2, North-Holland Publishing Company.

Pockrand et al, "Excition-Surface Plasmon Coupling: An Experimental Investigation", (Dec. 1982), pp. 6289-6295, Journal of Chemical Physics, vol. 77, No. 12, American Institute of Physics.

Quinten et al., "Optical Properties of Aggregates of Small Metal Particles", Surface Science, (1986), pp. 557-577, vol. 172, Elsevier Science Publishers B. V., North-Holland, Amsterdam.

Raether, "Surface Plasmons on Smooth and Rough Surfaces and on Gratings", Springer Tracts in Modern Physics, (1988), vol. 111, Springer-Verlag, Berlin Heidelberg, New York.

Rovve et al., "Ultrahigh-Vacuum Studies of Enhanced Raman Scattering from Pyridine on Ag Surfaces", Physical Review Letters, (Jun. 1980), pp. 1770-1773, vol. 44, No. 26.

Ruppin et al., "Phonon-Plasmon Modes in Small GaN Crystals", Journal of Physics and Chemistry of Solids, (1974), pp. 1311-1315, vol. 35, Pergamon Press.

Seraphin, "Spectrally Selective Surfaces and Their Impact on Photothermal Solar Energy Conversion", Ch. 2 of "Solar Energy Conversion: Solid-State Physics Aspects", (1979), pp. 5-55, vol. 31, Springer-Verlag, Berlin Heidelberg, New York.

Sobnack et al., "Stationary Surface Plasmons on a Zero-Order Metal Grating", Physical Review Letters, (Jun. 1998), pp. 5667-5670, vol. 80, No. 25, American Physical Society.

Strelow et al., "Chemisorption of Phosphine on Colloidal Silver in Aqueous Solution", Journal of Physical Chemistry, (1994), pp. 3032-3035, vol. 98, No. 11, American Chemical Society.

Stuart et al. "Enhanced Dipole-Dipole Interaction Elementary Radiators Near a Surface", Physical Review Letters, (Jun. 1998), pp. 5663-5666, vol. 80, No. 25.

Thio et al., "Surface-Plasmon-Enhanced Transmission Through Hole Arrays in Cr Films", Journal of Optical Society of America B, (Oct. 1999), pp. 1743-1748, vol. 16, No. 10, Optical Society of America.

Wiesner et al., "Anisometric Gold Colloids. Preparation, Characterization, and Optical Properties", Chemical Physics Letters, (May 1989), pp. 569-575, vol. 157, No. 6, Elsevier Science Publishers B.V.

Yatsuya et al., "A New Technique for the Preparation of Extremely Fine Metal Particles", Japanese Journal of Applied Physics, (1974), pp. 749-750, vol. 13, Physical Society of Japan and the Japan Society of Applied Physics.

Smolders et al., "Liquid-liquid Phase Separation in Concentrated Solutions of Non-crystallizable Polymers by Spinodal Decomposition", Kolloid-Z. u. Z. Polymere, (1971), pp. 14-20, 243.

U.S. Appl. No. 11/073,787, filed Mar. 7, 2005, entitled "Thermoplastic Film Having Metallic Nanoparticle Coating".

Lu, et al., "High Density Silver Nanoparticle Film with Temperature-Controllable Interparticle Spacing for a Tunable Surface Enhanced Raman Scattering Substrate," Nano Letters, vol. 5, No. 1, 5-9, 2005, pp. 5-9.

* cited by examiner

MICROPOROUS ARTICLE HAVING METALLIC NANOPARTICLE COATING

FIELD OF THE INVENTION

The present invention is directed to a metallic nanoparticle coated material, and the methods of using and preparing the same.

BACKGROUND

Metallic nanoparticles, having a diameter of about 1-100 nanometers (nm), are important materials for applications that include semiconductor technology, magnetic storage, electronics fabrication, and catalysis. Metallic nanoparticles have been produced by gas evaporation; by evaporation in a flowing gas stream; by mechanical attrition; by sputtering; by electron beam evaporation; by chemical reduction, by thermal evaporation; by electron beam induced atomization of binary metal azides; by expansion of metal vapor in a supersonic free jet; by inverse micelle techniques; by laser ablation; by laser-induced breakdown of organometallic compounds; by pyrolysis of organometallic compounds; by microwave plasma decomposition of organometallic compounds, and by other methods.

It is known that metallic nanoparticles possess unique optical properties. In particular, metallic nanoparticles display a pronounced optical resonance. This so-called plasmon resonance is due to the collective coupling of the conduction electrons in the metal sphere to the incident electromagnetic field. This resonance can be dominated by absorption or scattering depending on the radius of the nanoparticle with respect to the wavelength of the incident electromagnetic radiation. Associated with this plasmon resonance is a strong local field enhancement in the interior of the metal nanoparticle. A variety of potentially useful devices can be fabricated to take advantage of these specific optical properties. For example, optical filters or chemical sensors based on surface enhanced Raman scattering (SERS) have been fabricated.

SUMMARY

The present invention provides an article comprising a microporous material having a metallic nanoparticle coating thereon. By "metallic" it is meant elemental metals and compounds thereof. The microporous material may be in the form of films, sheets, or fibers, but is preferably in the form of films or sheets. The coated article provides a convenient means of storing nanoparticles and for transferring the same to another substrate, such as a glass, plastic, and metals. These coated substrates are useful in many devices and techniques that rely on the optical, chemical or magnetic properties of metallic nanoparticles including optical devices such as lenses, sheets, fibers, prisms, filters and chemical sensors.

The present invention overcomes limitations of the prior art by providing a stable article for storing and transferring nanoparticles. Heretofore, nanoparticles were deposited directly on the surface of a substrate by physical vapor deposition techniques, or by coating a dispersion/suspension of nanoparticles onto a substrate. Physical vapor deposition equipment is not amenable to continuous coating processes. Dispersions of nanoparticles are often unstable, as the nanoparticles tend to agglomerate and precipitate from solution. The use of dispersions also involves the use of and exposure to solvents and reducing agents and may contaminate the nanoparticles.

Advantageously, the process also allows one to control the nanoparticle coating density (nanoparticles per $cm^2$) on the substrate as the nanoparticles are transferred from the coated microporous membrane.

The article of the present invention may be used in the preparation of nanoparticle coated substrates used for such diverse applications as optical switching devices, optical communication systems, infrared detectors, infrared cloaking devices, chemical sensors, passive solar radiation collection or deflecting devices and the like.

In one embodiment the invention provides a method of preparing a nanoparticle coated microporous membrane comprising the steps of providing a microporous material, depositing a discontinuous coating of metallic nanoparticle on the surface of the microporous material by physical vapor deposition. The method may further comprise the step of stretching the nanoparticle-coated article either prior to deposition, or subsequent to deposition.

In another embodiment, the invention provides a nanoparticle coating on a substrate comprising: providing a substrate and the nanoparticle-coated microporous membrane and contacting the substrate and the nanoparticle-coated article with sufficient pressure to transfer at least a portion of said nanoparticle from said nanoparticle-coated article to a surface of said substrate.

As used herein:

The term microporous means having diluent phase and/or a gas such as air throughout the material in communicating or interconnected pores or voids of microscopic size (i.e., visible under a microscope but not with the naked eye).

As used herein, the term "thermoplastic polymer" refers only to conventional polymers, both crystalline and non-crystalline, which are melt processible under ordinary melt processing.

As used herein, the term "crystalline", as used with regard to the thermoplastic polymer, includes polymers that are at least partially crystalline. Crystalline polymer structures in melt-processed thermoplastic polymers are well known.

As used herein, the term "amorphous", as used with regard to the thermoplastic polymer, includes polymers without substantial crystalline ordering such as, for example, polymethylmethacrylate, polysulfone, and atactic polystyrene.

As used herein, the term "melting temperature" refers to the temperature at which the thermoplastic polymer, in a blend of thermoplastic polymer and compatible liquid, will melt.

As used herein, the term "crystallization temperature" refers to the temperature at which the thermoplastic polymer, in a melt blend of thermoplastic polymer and compatible liquid, will crystallize.

As used herein, the term "equilibrium melting point", as used with regard to the thermoplastic polymer, refers to the commonly accepted melting point temperature of the thermoplastic polymer as found in published literature.

Various features, embodiments and advantages of the invention will be apparent from the following detailed description of the invention and the claims. The above summary is not intended to describe each illustrated embodiment or every implementation of the present disclosure. The detailed description that follows more particularly exemplifies certain preferred embodiments utilizing the principles disclosed herein.

DETAILED DESCRIPTION

Figure 1:
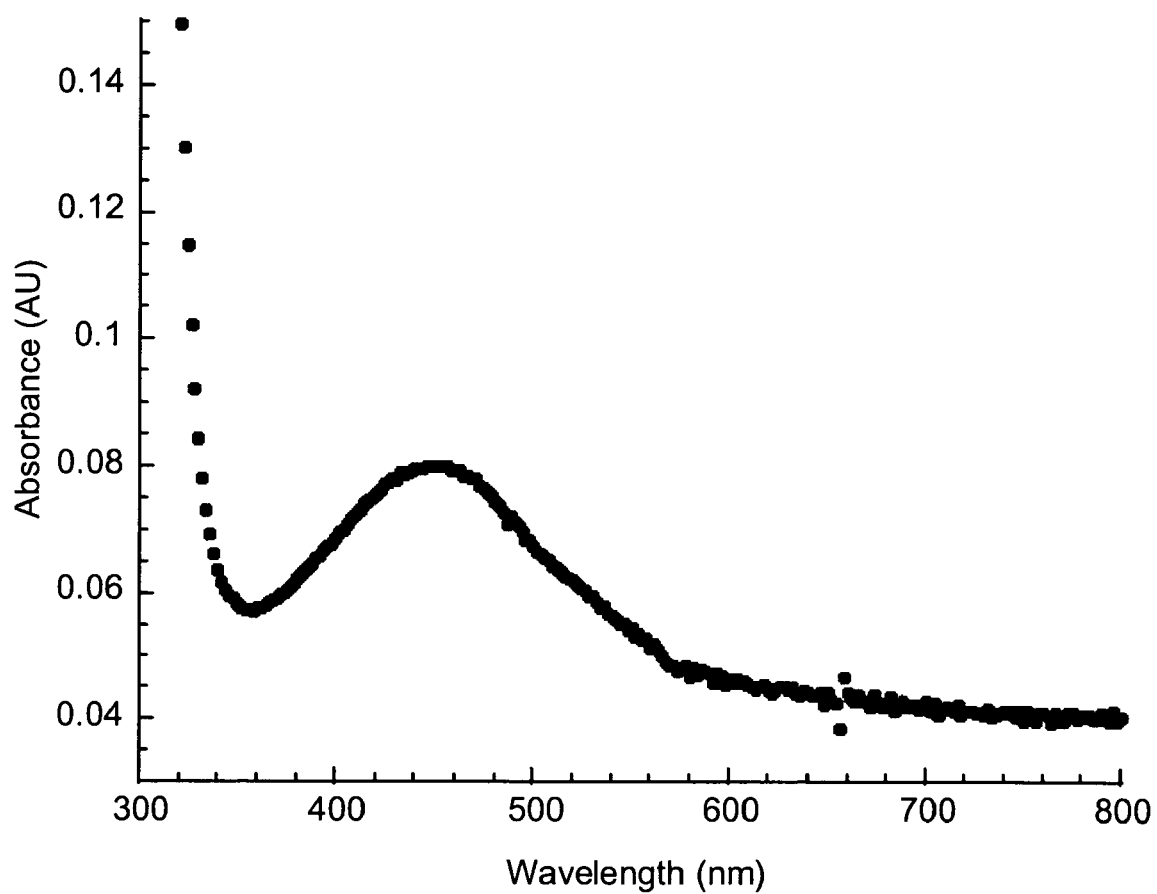
FIG. 1 is the absorption spectra of Example 2

The present invention is directed, in part, to a microporous membrane comprising a discontinuous metallic nanoparticle coating thereon. The nanoparticle coating is formed by depositing a discontinuous layer of metallic nanoparticles by a physical vapor deposition method. As used herein, "discontinuous" means the nanoparticle coating is disposed as islands of nanoparticles or agglomerates thereof, surrounded by uncoated areas. The majority of the metal nanoparticles are usually elemental metal nanoparticles, although other metallic nanoparticle such as oxides are also contemplated.

The present invention provides a metallic nanoparticle coating on a microporous material, the nanoparticles having a mean number average particle diameter in the range of 1 to 100 nanometers and most preferably 1 to 50 nanometers. The coating generally has an average thickness less than 100 nanometers, preferably less than 10 nanometers. The nanoparticles may be substantially spherical, but in some cases are elongated, having an aspect ratio (length to diameter) of greater than 1.5:1 (i.e. are substantially oblong). Optionally, the microporous membrane is stretched (oriented) prior to deposition, or subsequent to deposition.

The microporous material that receives the metallic nanoparticle coating may be characterized as a thermoplastic polymeric structure having a plurality of interconnected passageways to provide a network of communicating pores. Typical pore or void size in the microporous sheet is in the range of 100 Angstroms to 4 micrometers.

Generally, the microporous thermoplastic polymeric material may be prepared by the steps of:
a) melt-blending the thermoplastic polymer with a solubilizing amount of the compatible liquid (diluent) at a temperature sufficient to form a homogeneous solution;
b) forming an article from the solution;
c) cooling the shaped article at a rate and to a temperature sufficient to initiate thermodynamic, non-equilibrium phase separation;
d) further cooling the article to solidify the thermoplastic polymer; and
e) optionally removing at least a substantial portion of the compatible liquid.

The microporous membrane can optionally be oriented after solidification of the thermoplastic polymer, step d, or after removal of the compatible liquid, step e. The thermodynamic, non-equilibrium phase separation may be either liquid-liquid phase separation or liquid-solid phase separation.

When liquid-liquid phase separation occurs, the cells comprise void spaces encased by fibrous, lacy, or semi-continuous polymeric boundaries. Upon orientation, the cells become elongated in the direction of orientation. The cells of the oriented article are generally ellipsoidal in shape with an aspect ratio of major axis to minor axis greater than 1.0 and a major axis generally lying in a plane parallel to the surface of the article. When liquid-solid phase separation occurs, the material has an internal structure characterized by a multiplicity of spaced, randomly disposed, non-uniform shaped, equiaxed particles of thermoplastic polymer, adjacent particles throughout said material being separated from one another to provide the material with a network of interconnected micropores and being connected to each other by a plurality of fibrils consisting of the thermoplastic polymer. The fibrils elongate upon orientation providing greater spacing between the thermoplastic polymer particles and increased porosity.

Useful thermoplastic polymers include olefinic, condensation and oxidation polymers, including polyamides, polyimides, polyurethanes, polyolefins, polystyrenes, polyesters, polycarbonates, polyketones, polyureas, polyacrylates, and polymethacrylates. Representative olefinic polymers include high and low density polyethylene, polypropylene, polyvinyl-containing polymers, butadiene-containing polymers, acrylate containing polymers such as poly(methyl methacrylate), and fluorine-containing polymers such as polyvinylidene fluoride. Condensation polymers include polyesters such as polyethylene terephthalate and polybutylene terephthalate, polyamides such as nylon 6, nylon 11, nylon 13, and nylon 66, polycarbonates and polysulfones. Polyphenylene oxide is representative of the oxidation polymers that can be used. Blends of thermoplastic polymers may also be used.

Examples of suitable crystallizable polymers include addition polymers such as polyolefins and condensation polymers such as polyesters and polyamides. Useful polyolefins preferably include the polymers of ethylene and propylene but also may include methylpentene, butene, 1-octene, styrene, and the like, and copolymers of two or more such olefins that may be polymerized to contain crystalline and amorphous segments and mixtures of stereo-specific modification of such polymers e.g., mixtures of isotactic polypropylene and atactic polypropylene, isotactic polystyrene and atactic polypropylene. Useful polyesters include polyethyleneterephthalate, polybutylene-terephthalate, polyhexamethyleneadipate, polyhexamethylenesuccinate, and polyester copolymers. Useful polyamides include polyhexamethyleneadipamide, polyhexamethylenesebacamide and polycaprolactam. These are described, for example, in U.S. Pat. Nos. 4,247,498, 4,539,256, 4,726,989, 4,867,881, and 4,849,311, each incorporated herein by reference.

The compatible liquid (often referred to as diluent) is a material which is capable of forming a solution with the thermoplastic polymer when heated above the melt temperature of the polymer and which phase separates from the polymer on cooling. The compatibility of the liquid with the polymer can be determined by heating the polymer and the liquid to form a clear homogeneous solution. If a solution of the polymer and the liquid cannot be formed at any liquid concentration, then the liquid is inappropriate for use with that polymer. In practice, the liquid used may include compounds that are solid at room temperature but liquid at the melt temperature of the polymer. Generally, for non-polar polymers, non-polar organic liquids with similar room temperature solubility parameters are generally useful at the solution temperatures. Similarly, polar organic liquids are generally useful with polar polymers. When blends of polymers are used, useful liquids are those that are compatible liquids for each of the polymers used. When the polymer is a block copolymer such as styrene-butadiene, the liquid selected must be compatible with each type of polymer block. Blends of two or more liquids can be used as the compatible liquid as long as the selected polymer is soluble in the liquid blend at the polymer melt temperature and the solution formed phase separates on cooling.

Various types of organic compounds have been found useful as the compatible liquid, including aliphatic and aromatic acids, aliphatic, aromatic and cyclic alcohols, aldehydes, primary and secondary amines, aromatic and ethoxylated amines, diamines, amides, esters and diesters, ethers, ketones and various hydrocarbons and heterocyclics. When the polymer selected is polypropylene, aliphatic hydrocarbons such as mineral oil, esters such as dibutyl phthalate and ethers such as dibenzyl ether are useful as the compatible liquid. When high-density polyethylene is the polymer, an aliphatic hydrocarbon such as mineral oil or aliphatic ketone such as methyl nonyl ketone or an ester such as dioctyl phthalate are useful as the compatible liquid. Compatible liquids for use with low-density polyethylene include aliphatic acids such as decanoic acid and oleic acid or primary alcohols such as decyl alcohol. When the polymer is polyvinylidene fluoride, esters such as dibutyl phthalate are useful as the compatible liquid. When the polymer selected is nylon 11, esters such as propylene carbonate, ethylene carbonate, or tetramethylene sulfone are useful as the compatible liquid. When the polymer selected is polymethylmethacrylate, useful compatible liquids include, 1,4-butanediol and lauric acid. A compatible liquid for use with the polymer polyphenylene oxide is, for example, tallow amine.

The actual polymer concentration selected from within the predetermined concentration range for the diluent-polymer system being used is limited by functional considerations. The polymer concentration and molecular weight should be sufficient to provide the microporous structure which is formed on cooling with adequate strength for handling in further processing steps. The polymer concentration should be such that the viscosity of the liquid-polymer melt solution is suitable for the equipment used to shape the article. Generally, the polymer concentration in the compatible liquid is about 10 to 80 weight percent, which corresponds to a compatible liquid concentration of 20 to 90 weight percent. The relative amounts of thermoplastic polymer and compatible liquid vary with each system. The polymer concentration which can be used in a given system can be determined by reference to the temperature-composition graph for a polymer-liquid system as set forth in Smolders, van Aartsen and Steenbergen, Kolloid-Z.u.Z. Polymere, 243, 14-20 (1971).

The microporous membranes may be oriented in at least one direction, i.e., stretched beyond their elastic limit to introduce permanent set or elongation and to ensure that the micropores are permanently developed or formed. The stretching step normally comprises biaxially stretching the shaped article. The stretching step provides an area increase in the shaped article of from about 10% to over 1200% over the original area of the shaped article. Orientation can be carried out either before or after removal of the compatible liquid. This orientation of the structures aids in controlling pore size and enhances the porosity and the mechanical properties of the material without changing the particle uniformity and degree of agglomeration in the polymer phase. Additional stretching may also be done to improve film strength characteristics. This can result in films with improved tear resistance.

Orientation of membranes of the invention can be used as a process variable to control thickness and relatively thin microporous membranes can be produced. Orientation enables production of thin films with minimal difficulty. Orientation also enhances the mechanical strength of the films that is beneficial in many microporous membrane applications. With increasing orientation, film thickness and resistance to flow are proportionately reduced, mechanical strength and porosity are proportionately increased, and the pore size range is extended with improved pore size control, so that an excellent balance of desired properties can be attained through selection of the amount of orientation to which the microporous membrane is subjected. On stretching, the polymer particles are pulled apart, permanently attenuating the polymer in zones of continuity, thereby forming fibrils and minute voids between coated particles, and creating a network of interconnected micropores. Such permanent attenuation also renders the article permanently opaque.

If the diluent is not removed, the diluent either remains coated on or at least partially surrounds the surface of the resultant porous polymer phase and comprises a concentration of 20 to 90 weight percent based on diluent and polymer.

The diluent may be removed at least partially to achieve the desired degree of porosity and reduce the amount of diluent transferred to a substrate along with the nanoparticles. Removal can be accomplished by known techniques such as washing, solvent extraction, displacement, volatilization, or any other convenient methods. If performed before stretching or in place of stretching, the resulting film is opaque. If diluent removal is performed before or after stretching, the resulting film remains opaque and is more porous than a film that has only been stretched. Diluent removal occurs prior to nanoparticle deposition else the metallic nanoparticles may also be lost during the diluent removal. Upon diluent removal, the microporous membrane may comprise less than 20 wt. % or less than 10 wt. % diluent, although typically, a microporous membrane will comprise at least 5 wt. % diluent even after diluent removal.

The microporous sheet materials may be laminated, bonded or otherwise affixed to various other materials such as, for example, woven, knitted, or non-woven fabrics, polymeric films, or to one or more additional layers of similar or other microporous sheet material to achieve, for example, desired thicknesses, porosity gradients, handling properties, and mechanical properties. The additional layers may be affixed before or after deposition. The additional layer(s) are affixed to the major surface opposition the nanoparticle-coated surface, i.e. the noncoated surface. Lamination can be carried out using conventional techniques such as adhesive bonding, spot welding, or other techniques that do not deleterious affect the nanoparticle coating.

Useful processes for preparing microporous membranes may be found in the following references, incorporated herein by reference.

U.S. Pat. No. 4,247,498 (Castro) discloses microporous polymers characterized by a relatively homogeneous, three-dimensional cellular structure having cells connected by pores of smaller dimension. The microporous polymers are prepared from thermoplastic polymers by heating a mixture of the polymer and a compatible liquid to form a homogeneous solution, cooling the solution under non-equilibrium thermodynamic conditions to initiate liquid-liquid phase separation, and continuing the cooling until the mixture achieves substantial handling strength.

U.S. Pat. No. 4,539,256 (Shipman) discloses a microporous sheet material characterized by a multiplicity of randomly spaced, dispersed, equiaxed, non-uniform shaped particles of the thermoplastic polymer, adjacent thermoplastic particles connected to each other by a plurality of fibrils of the thermoplastic polymer. The sheet materials are prepared by melt blending crystallizable thermoplastic polymer with a compound which is miscible with the thermoplastic polymer at the melting temperature of the polymer but phase separates on cooling at or below the crystallization temperature of the polymer, forming a shaped article of the melt blend, cooling the shaped article to a temperature at which the polymer crystallizes to cause phase separation to occur between the thermoplastic polymer and the compound.

U.S. Pat. No. 4,726,989 (Mrozinski) discloses microporous materials incorporating a nucleating agent made by melt blending a crystallizable thermoplastic polymer with a nucleating agent which is capable of inducing subsequent crystallization of the thermoplastic polymer and with a compound which is miscible with the thermoplastic polymer at the melting temperature of the polymer but phase separates on cooling at or below the crystallization temperature of the polymer, forming a shaped article of the melt blend, cooling the shaped article to a temperature at which the nucleating agent induces the thermoplastic polymer to crystallize so as to cause phase separation to occur between the thermoplastic polymer and the compound.

U.S. Pat. No. 4,867,881 (Kinzer et al.) describe a microporous article comprising a thermoplastic polymeric structure formed by liquid-liquid phase separation having a plurality of cells with adjacent cells being interconnected by passageways to provide a network of communicating pores, said cells comprising void spaces encased by fibrous, lacy, or semi-continuous boundaries and being ellipsoidal in shape, and said structure being oriented in at least one direction.

The nanoparticle coatings are prepared by physical vapor deposition techniques that generate the nanoparticles. Metal is heated under reduced pressure until vaporization occurs. Optionally, the metal vaporizes in the presence of a gas stream wherein the gas preferably is inert (nonreactive), although any gas that does not react with the metal may be used. The nanoparticles are transported or directed to a microporous material (optionally by the gas stream) and deposited by impinging the metallic vapor onto the microporous material, wherein nucleation and nanoparticle growth occurs. Generally in the absence of a gas stream the physical vapor deposition technique produces a metallic vapor than directly nucleates on the microporous material surface. In the presence of a gas, the metallic vapor undergoes some degree of homogenous nucleation in the stream to produce the nanoparticles, which are deposited on the microporous material surface.

The coating may be prepared by a method comprising the steps:
  a) vaporizing a metal, optionally in the presence of a non-reactive gas stream, to provide metallic vapor,
  b) optionally providing a second reactive gas capable of reacting with the metallic vapor (or metallic nanoparticles formed in the metallic vapor), and reacting the reactive gas with the metallic vapor (or metallic nanoparticles) to convert the same to metal oxide nanoparticles, and
  c) impinging the metallic vapor onto the microporous material, wherein nucleation and growth of the nanoparticles occurs, to provide a nanoparticle coating thereon.

The deposition of the metallic nanoparticles on the microporous material surface may be achieved using one of several physical vapor deposition techniques known to those of ordinary skill in the art. Such processes include vapor deposition, cathode sputtering, pyrolysis, ion plating, e-beam deposition, and the like. Vapor deposition and cathode sputtering are often preferred in view of the uniformity of structure and thickness that can be obtained. Reference is made to Vacuum Deposition of Thin Films, L. Holland, 1970, Chapman and Hall, London, England with regard to the many available means of providing metal vapors and vapor coating techniques. If desired, the nanoparticle layer may be pattern coated by means of a mask, so that the metallic nanoparticle surface may be patterned.

Average thickness of the nanoparticle coating may be measured during deposition using a commercially available quartz crystal microbalance. After deposition a number of chemical assays can be used to characterize the quantity of metal in any specified area. Particle diameter (formed by agglomeration of the nanoparticles) is typically measured using light scattering techniques known in the art. Primary particle diameter is typically measured using transmission electron microscopy or atomic force microscopy.

Physical vapor deposition (PVD) processes involve the deposition of atoms, typically by evaporation or sputtering in a vacuum. PVD processes can be characterized by the steps of (1) generating a metallic vapor by evaporation or sputtering using resistance, induction, electron-beam heating, laser-beam ablation, direct current plasma generation, radio-frequency plasma generation, molecular beam epitaxy, or similar means; (2) transport of the metallic vapor from the source to the substrate by molecular flow, viscous flow, plasma gas transport, or the like; and (3) nanoparticle growth on the thermoplastic polymer film, wherein nucleation and growth of the nanoparticles occurs. With PVD a variety of substrate temperatures can be used to control the crystallization and growth mode of the material deposited, although generally the temperature of the thermoplastic polymer film is below the distortion temperature of the polymer.

To avoid deformation or melting of the film substrate during deposition, the microporous material is generally maintained at a temperature at or below the distortion temperature of the polymer. The integrity of the microporous material is maintained by controlling the deposition rate so that the temperature of the nanoparticles, or the heat released by the nanoparticles upon deposition (heat of condensation) does not lead to thermal deformation of the film. Generally, the temperature of the microporous material is maintained at ambient conditions of the deposition chamber, and no special cooling of the film is required.

In a preferred embodiment, the nanoparticle coatings are applied to the microporous material by electron beam evaporation. This technique is based on heat production by high-energy electron beam bombardment on the metal to be deposited. The electron beam is generated by an electron gun, which uses the thermionic emission of electrons produced by an incandescent filament (cathode). Emitted electrons are accelerated towards an anode by a high difference of potential (kilovolts). The crucible (containing the source metal) itself or a near perforated disc can act as the anode. A magnetic field is often applied to bend the electron trajectory, allowing the electron gun to be positioned below the evaporation line. As electrons can be focused, it is possible to obtain a very localized heating on the metallic material to evaporate, with a high density of evaporation power (several kW). This allows control of the evaporation rate, from low to very high values. Cooling the crucible avoids contamination problems from heating and degasification.

Physical vapor deposition by sputtering is accomplished in a partial vacuum (between 13.3 to 1.33 Pa for a diode system and between 1.3 to 0.13 Pa for a magnetron system) when the target (usually a cathode) is bombarded with gas ions propelled by an electric field. The sputtering gas is typically a noble gas such as argon but the sputtering gas could include reactive elements that can be incorporated into the deposited film such as the deposition of nitrides, oxides and carbides. When the sputtering gas is ionized a glow discharge or plasma is produced. The gas ions are accelerated towards the target by an electric or electric and magnetic fields. Atoms from the target are ejected by momentum transfer and move across the vacuum chamber to be deposited on the substrate (the thermoplastic polymer film).

In another embodiment, the nanoparticle coatings are applied to the microporous material by sputter deposition. The sputtering apparatus generally consists of a three-source magnetron sputtering system arranged around the outer circumference of a cylindrical chamber containing a 38 cm (15 inch) diameter rotating drum. The substrates were mounted on the drum and rotated sequentially past positions in front of the sputtering sources at rates of between 1 and 8 rpm. The sources are shielded such that the sample is not coated from any two fluxes at the same time. The rate of material deposition and speed of rotation of the substrate in front of the targets determines the individual layer thicknesses comprising the final catalyst particles. Any vacuum pump that can draw a sufficient vacuum may be used. One such vacuum pump is a Varian AV8 cryopump (Varian Associates, Lexington, Mass.), which can be used in conjunction with an Alcatel 2012A rotary vane-roughing pump (Alcatel Vacuum Products, Hingham, Mass.). The cryopump may be partially isolated from the chamber by a butterfly valve. During deposition pressure may be maintained at 0.28 Pa (2.1 millitorr) as the sputtering gas flow rate was controlled by MKS flow controllers (MKS Instruments Inc., Andover, Mass.). Any inert or reactive sputtering gases may be used. Preferably either argon or an argon, oxygen mix is used. Control of the oxygen stoichiometry can be achieved by varying the argon/oxygen flow ratio. Any appropriate targets and power sources may be used. In one embodiment, an Advanced Energy MDX 500 power supply (Advanced Energy Industries, Inc., Fort Collins, Colo.) is used in the constant power mode of the power supply.

Useful metals that may be used in the physical vapor deposition step include, for example, Li, Na, K, Rb, Cs, Fr, Be, Mg, Ca, Sr, Ba, Ra, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, In, Tl, Sn, Pb, mixtures, oxides and alloys of these metals and even the lanthanides and actinides, if desired. Metals may be deposited sequentially or simultaneously.

Particularly useful metals are gold, aluminum, copper, iron, platinum, palladium, iridium, rhodium, osmium, ruthenium, titanium, cobalt, vanadium, magnesium, silver, zinc, and cadmium, indium, lanthanum, indium tin oxide (ITO) and antimony tin oxide (ATO), antimony indium tin oxide (AITO), tin, boron, lanthanum hexaboride, rare earth metals and mixtures and alloys thereof, and mixtures and alloys thereof. Most preferred are the noble metals. Other metals are apparent to those skilled in the art.

The process may involve evaporation of the elemental metal itself, as with Au or Ag, or may involve evaporation of a precursor form with generation of the actual elemental metal taking place during the transport stage prior to contacting the polymeric film. An example would be evaporation of silver metal using argon as a nonreactive gas with subsequent exposure of the silver nanoparticles to a reactive oxygen environment, thereby forming ultrafine silver oxide coated nanoparticles (the particle core being silver) prior to contacting the polymeric film. Since the reactive gas is introduced at a site remote from the vaporization source after the nanoparticles have formed, the final nanoparticles consist of a central core and an outer shell, where the central core can be metal and where the outer shell can be comprised of a layer formed by reaction of the reactive gas with the metal nanoparticles.

Where used, the inert gas is generally selected from He, Ne, Ar, Xe, and $N_2$. Mixtures of two or more nonreactive gases can also be used. When modification of the metal is desired, a reactive gas can be introduced through a gas inlet that is positioned so as to minimize reaction with the bulk material in the crucible and allow thorough mixing of the reactive gas with the particles entrained in the gas stream, thereby allowing reaction with the particles to occur. The reactive and nonreactive gases generally are at room temperature but the temperature can be elevated or reduced as desired. The term reactive includes 1) direct reaction with the particles, as in the case of metals, for example, with $O_2$, NO, $NO_2$, $CO_2$, CO, $AsH_3$, $H_2S$, $H_2Se$, $NH_3$, trimethylchlorosilane, methylamine, ethylene oxide, water, HF, HCl, or $SO_2$, or combinations thereof, to form the corresponding oxides or other compounds; or 2) adsorption, in which a volatile substance is introduced in the gas prior to contacting the dispersing medium, but the substance is either not a liquid under normal conditions (atmospheric pressure and 25° C.), the substance is not miscible with the dispersing medium, or else the substance acts to protect the surface of the nanoparticles from the dispersing medium or additives within the dispersing medium. Typical substances that could be adsorbed include polymers such as poly(methylmethacrylate) and polystyrene.

A useful apparatus for coating of the nanoparticles comprises:

a) a furnace connected to a collection vessel, the furnace containing a heating means (e.g., resistive, inductive, e-beam, infrared, laser, plasma jet) and adapted to contain at least a first and optionally a second gas inlet tube, said second tube being located downstream from said first tube, and a means (e.g., a pump such as a rotary oil pump, an oil diffusion pump, piston pump, a Roots™ blower, and a turbomolecular pump) for evacuating the furnace and collection vessel, the vessel containing a dispersing medium;

b) means (e.g., a ceramic, or metal crucible or slab that can be preloaded with metal or which can be continuously or batch-wise fed during operation of the apparatus, or the electrodes can be the means) for introducing a metal into said furnace and evacuation thereof;

c) optionally, means (e.g., a micro metering valve, electronic flow controller, or gas dispersing tube) for introducing through the first inlet tube a first, non-reactive gas stream into the furnace;

d) means (e.g., energy input as by e-beam, infrared, laser, inductive, resistive, or plasma jet) for evaporating the metal nanoparticles into the first gas stream;

e) means for allowing condensation of the vaporized metallic nanoparticles (e.g., decreasing the temperature, raising the pressure, changing the chemical nature of the nonreactive gas, controlling the length of the transfer tube, controlling the gas flow rate, or combinations thereof) in the first gas stream to produce a dispersion of nanoparticles into the first gas stream;

f) optionally, means (e.g., a micro metering valve, electronic flow controller, or gas dispersing tube) for introducing into the furnace through the second inlet tube a second, reactive gas stream, to allow reaction with the metallic nanoparticles;

g) means for impinging the nanoparticles onto the thermoplastic microporous material surface.

Other reactor designs to provide dispersions of the invention can be envisioned, including a rotary metal atom reactor such as described in Metal Vapour Synthesis in Organometallic Chemistry, J. R. Blackborow and D. Young, Springer-Verlag (N.Y.), 1979 and a spinning disk assembly such as described in Jpn. J. Appl. Phys., 13, 749 (1974). Both types of reactors could be used to generate dispersions of organic pigments. In addition to resistive heating, other means of applying heat to the pigment or pigment precursor may be envisioned. These include laser heating, inductive heating, plasma jet, plasma arc discharge, and others known to those skilled in the art.

The thermoplastic microporous material may be stretched before or after deposition of the metallic nanoparticles, but preferably before deposition. The conditions for stretching are chosen such that the integrity of the membrane and nanoparticle coating are maintained. Thus when stretching in the machine and/or transverse directions, the temperature is chosen such that substantial tearing, distortion or fragmentation of the membrane is avoided. The film may be vulnerable to tearing or even catastrophic failure if the temperature is too low, or the stretching ratio(s) is/are excessively high. Preferably, the stretching temperature is above the glass transition temperature of the polymer. Such temperature conditions permit stretching in the X and Y directions without loss of film integrity.

The polymer film may be stretched along one major axis (uniaxial), and may further be stretched along two major axes (biaxial). The stretching may be sequential or simultaneous. The degree of stretching is generally defined by the draw ratio, that is, the ratio of the final area to the original area. This stretching may be effected by a combination of techniques in the present invention, including the steps of calendering and length stretching. In general, the total draw ratio is at least 1.1X, and preferably at least 5X.

When stretched, the core polymeric body may also be allowed to dimensionally relax in the cross-stretch direction from the natural reduction in cross-stretch (equal to the square root of the stretch ratio) or may also be constrained (i.e., no substantial change in cross-stretch dimensions). The microporous membrane may be stretched in the machine direction, as with a length orienter, and in the width direction using a tenter, or at diagonal angles.

If desired, the microporous membrane may be annealed, preferably after stretching at a sufficient temperature to relieve stress but not so long or at so high a temperature that degradation of the membrane or coating results. Suitable annealing temperatures vary with the type of polymer used. Preferably no pressure is applied to the film during the annealing step. Ordinarily the film to be annealed is merely laid on a non-adherent support around which hot air is circulated or over which radiant heaters are placed.

If desired, the nanoparticle-coated article may further comprise a protective layer for isolating the nanoparticles from environmental effects and mechanical stresses. The protective layer is desirably releasably affixed to the coated surface of the microporous material, so that it may be removed and the nanoparticles transferred to a substrate surface. The additional layer may be in contact with the metallic nanoparticle layer and the exposed surface of the thermoplastic film layer (i.e. the uncoated regions). This layer protects the nanoparticle layer from abrasion or oxidation, as well as to impart chemical resistance.

Additionally, the uncoated surface of the coated microporous membrane may have a support layer bonded, laminated, affixed or otherwise adhered to the uncoated major surface of the microporous membrane. The support layer can be coextruded onto the a surface of the microporous layer prior to deposition, or the support layer can be coated, bonded or laminated onto the non-coated surface of the microporous layer using a suitable pressure sensitive or non-pressure sensitive adhesive. The support layers are preferably made of a thermoplastic polymer, which may be the same or different as that used in the construction of the thermoplastic polymer film layer. Other suitable coatings include, but are not limited to, hardcoats, adhesives, antistatics, adhesion promoting primers, UV stabilizing coating, friction reduction layers, etc.

After deposition of the discontinuous nanoparticle coating, the majority of the metallic nanoparticles are partially affixed on the major surface of the microporous membrane and exposed when viewed perpendicular to the major surface. As physical vapor deposition processes are "line of sight" processes, a minority (less than 50%) of the nanoparticles may be found within the micropores below the major surface, but in immediate communication with the atmosphere. While not wishing to be bound by theory, it is believed that the metallic nanoparticles are affixed to the microporous polymer by means of the residual diluent that coats the surface thereof. However some of the nanoparticles may be affixed directly to the polymer surface by partial melting of the polymer fibrils as result of the latent heat of deposition. Regardless of the means by which the nanoparticles are affixed to the microporous membrane, the attachment is sufficiently weak to allow pressure transfer to a substrate.

The present invention also provides an article and method of depositing a nanoparticle coating on a substrate by contacting the nanoparticle coated microporous surface with a suitable substrate with sufficient pressure to effect transfer at least partial transfer. To effect transfer, only slight pressure ($<1$ lb/inch$^2$) is necessary, although higher pressure may be used. "Partial transfer" means at least 10% of the nanoparticles are transferred from the microporous membrane to the intended substrate. Preferably at least 50% of the nanoparticles are transferred. While not wishing to be bound by theory, it is believed that the residual diluent aids in transfer of the nanoparticles by providing a liquid vehicle. As pressure is applied, some of the diluent (having the nanoparticles dispersed therein) is forced from the microporous membrane onto the substrate surface.

Transfer may be effected by hand or finger pressure, but an implement such as a roller, stylus, stamp or press may be used. If desired, the nanoparticles may be transferred in a preselected pattern whereby a template, mask or stamp configured with the desired pattern is contacted with the nanoparticle-coated article or the substrate and pressure applied. Transfer may be effected by momentary pressure, or the pressure may be maintained for several minutes, as with a press. Although heat is not required, in some applications heat may be applied with pressure to effect the transfer.

The substrate can be made of any suitable material and can be chosen from a wide variety of films, sheets, wafers, and other surfaces, depending upon the particular end-use application. Useful substrates include inorganic substrates such as metals, glass, ceramic, silicon and ITO and organic substrates including thermoplastic and thermoset polymers such as polyolefins, polyethersulfones, polycarbonates, polyesters, polyarylates, polyimides, polymeric multilayer films, and organic/inorganic composite multilayer films. Flexible rolls or sheets of glass can also be used. For many optical applications substrate material desirably transparent, or can also be opaque to visible light such as, for example, stainless steel, crystalline silicon, poly-silicon, or the like. The substrate can optionally be pre-treated with a primer (for example, silane coupling agents) to enhance adhesion of nanoparticles.

Antimicrobial articles may be prepared by transferring silver, silver oxide (or other silver-containing compounds) nanoparticles to a woven or nonwoven textile or polymeric fabric, or polymeric film substrate. In some applications it may be desirable to transfer antimicrobial nanoparticles directly to skin, such as at a wound or incision site.

Advantageously, the process also allows one to control the nanoparticle coating density on the substrate as the nanoparticles are transferred from the coated microporous membrane. The microporous article may be stretched (by orientation) or shrunk (by application of heat to an oriented microporous article) as desired. As the article is shrunk, the interparticle distance will be reduced so a greater coating density is imparted to the transferred substrate. Conversely, as the coated microporous membrane is stretched, the interparticle distance in increased and a reduced coating density is imparted.

The present invention provides a means for producing an optical element comprising the step of contacting the nanoparticle coated microporous membrane with a suitable substrate at a pressure, and for a time sufficient, to transfer a portion of the nanoparticles from the microporous membrane to the substrate.

Such optical elements preferably display surface plasmon resonance (SPR), which is the resonant excitation of oscillating free charges at the interface of the metallic nanoparticles and a dielectric. When SPR spectra are generated and collected, they can be used to determine specificity, kinetics, affinity, and concentration with respect to the interactions between two or more molecules, where one of the molecules is attached to a solid sensing surface. Reaction kinetics corresponds to both an association and a dissociation rate at which an analyte interacts with the bound detection molecule. Affinity refers to the strength with which an analyte binds to the detecting molecule. Specificity refers to the propensity of a molecule to bind to the detecting molecule to the exclusion of other molecules. SPR spectra have been used in studies involving many types of molecules including proteins, peptides, nucleic acids, carbohydrates, lipids, and low molecular weight substances (e.g., hormones and pharmaceuticals).

Although the transferred metallic nanoparticles are generally non-conductive, present invention is also useful in producing conductive traces, such as in electronic circuits. The method comprises transferring the nanoparticles in a preselected pattern to the surface of a shrinkable polymeric film. The shrinkable film, bearing a metallic nanoparticle patterned coating, is then heated to effect shrinkage of the film, so that the interparticle distance is reduced and the coating becomes conductive. Reference to suitable shrinkable films and the means to effect shrinkage may be found in U.S. Pat. No. 7,033,667 (Voss-Kehl et al.) incorporated herein by reference.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

Table of Abbreviations

| Abbreviation or Trade Designation | Description |
|---|---|
| Microporous membrane | 33 micrometer polypropylene microporous membrane having a porosity of 70% and prepared as described in Example 2 of U.S. Pat. No. 5,238,623 (Mrozinski et al.), incorporated herein by reference. |
| Glass Slide | Glass slide with a thickness of 0.2 millimeters commercially available from VWR Scientific; West Chester, PA. |
| ITO Glass Slide | ITO (Indium Tin Oxide) coated glass slides with a thickness, which includes the ITO coating, of 1.6 millimeter. |
| PTFE 5490 tape | Commercially available from 3M Company; St. Paul, MN. |
| Polyethylene film | Clear monoaxially oriented polyethylene of 25 micrometer thickness commercially available from Changhou Plastics; Guanming, China. |

-continued

Table of Abbreviations

| Abbreviation or Trade Designation | Description |
|---|---|
| PET film | Polyethylene terephthalate film of 51 micrometer thickness commercially available from Changhou Plastics; Guanming, China. |
| MMOP film | Micropatterned monoaxially oriented polyethylene film patterned by pressing the film onto a stainless steel microreplicated tool at room temperature in a hand press (Carver Hand Press Model C made by Fred Carver Inc.; Wabash, IN). |
| TEMOP film | Thermally embossed monoaxially oriented polyethylene film patterned by heat embossing on a calendar roll at 191° C. (375° F.). |
| MOP film | Clear monoaxially oriented polyethylene of 25 micrometer thickness commercially available from Changhou Plastics; Guanming, China. |

Example 1

Silver nanoparticles were e-beam evaporated onto microporous membrane to yield a 40-Angstrom coating. The microporous membrane had a white opaque appearance due to the scattering of light by the porous structure but the resulting coated film had a yellowish tint characteristic of silver colloid nanoparticles. The silver coated biaxially oriented films were attached to a metal plate with masking tape and then passed through a UV radiation source (Fusion UV Processor model DRS-120 equipped with an H bulb, from Fusion UV Systems Inc.; Gaithersburg, Md.) at 3.0 meters/minute (10 ft/minute). The exposure caused pore collapse as result of energy absorption and the film became translucent orange upon exposure. The films were analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software (Hewlett Packard). The translucent region exhibited an absorption maximum at 425 nanometers.

Example 2

A sample of silver coated microporous membrane was prepared as described in Example 1. The silver nanoparticles were transferred to a Glass Slide using a hand press (Carver Hand Press Model C made by Fred Carver Inc.; Wabash, Ind.) with about a 13×13 centimeter (5×5 inch) platen. A 51-micrometer thick Teflon sheet was utilized on top of the film to avoid breakage of the glass slide. The contact surface was approximately (3 square inches) and the pressure registered on the press was (15,000 psi). A yellowish tint on the glass was present after the transfer indicating that the transfer of nanoparticles had occurred. The nanoparticle coated Glass Slide was analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. The plasmon peak was centered at about 450 nanometers as shown in FIG. 1. Preparation of a series of nanoparticle coated Glass Slides was carried out. These slides were stacked and analyzed using a UV-Vis Spectrophotometer as above. The intensity of the plasmon peak increased in an additive manner with the numbers of slides in the stack but there was no shift in the location of the peak.

Example 3

Figure 2:
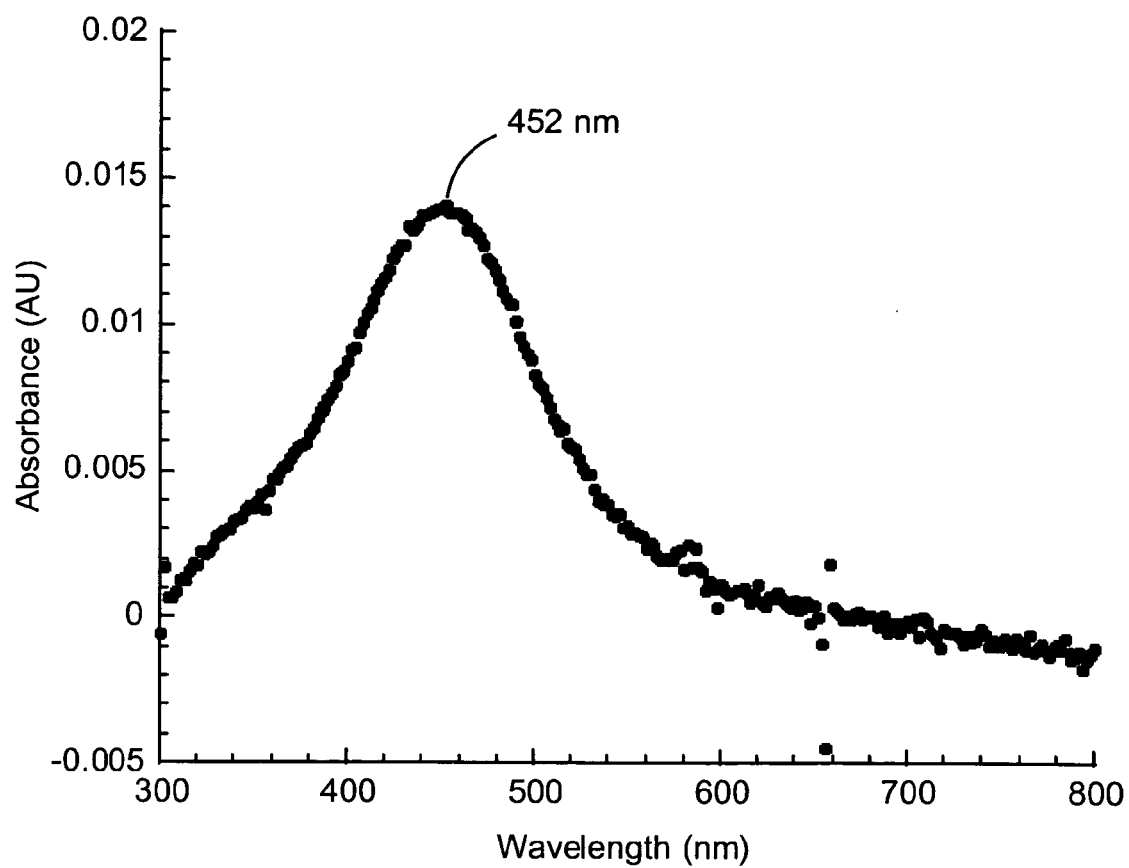
FIG. 2 is the absorption spectra of Example 3

A similar transfer procedure as described in Example 2 was carried out with ITO Glass Slides. The nanoparticle coated Glass Slide was analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. At first it appeared that the plasmon peak was smeared by the conductive surface, however, upon subtraction of the ITO surface background, the plasmon peak was observed at 452 nanometers as shown in FIG. 2.

Example 4

A similar procedure to that described in Examples 2 and 3 was utilized to transfer silver nanoparticles to a flexible polymeric material. A sample of silver coated microporous membrane was prepared as described in Example 1. A piece of PTFE 5490 tape was placed adhesive side down over the silver coated Microporous membrane. When the tape was peeled away some of the silver nanoparticles transferred to the adhesive layer of the tape. The nanoparticle coated tape surface was analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. Upon subtraction of the PTFE surface background, the plasmon peak was observed at 452 nanometers. Deformation of the tape sample in 2 directions causes the plasmon resonance peak maximum to shift to 520 nanometers.

Example 5

A similar procedure to that described in Example 4 was utilized to transfer silver nanoparticles to a flexible polymeric material. A sample of silver coated microporous membrane was prepared as described in Example 1. Silver nanoparticles were transferred to polyethylene film as described in Example 4. The nanoparticle coated film surface was analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. The plasmon peak was observed at 440 nanometers.

Example 6

A sample of silver coated microporous membrane was prepared as described in Example 1. Silver nanoparticles were transferred to a piece of PET film as described in Example 4. The nanoparticle coated film surface was analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. The plasmon peak was observed at 450 nanometers.

Examples 7-9

Samples of silver coated microporous membrane were prepared as described in Example 1. Silver nanoparticles were transferred to a piece of MMOP film (Example 7), TEMOP film (Example 8) or MOP film (Example 9) as described in Example 4. The nanoparticle coated film surfaces were analyzed using a UV-Vis Spectrophotometer HP 8452A.Rev.A in the wavelength range of 190 to 820 nanometers, with the sampling interval of 2 nanometers, integration time of 0.5 seconds, and the path length was 1 centimeter. The data was processed by 845X UV-Vis System I software. For Example 7 (MMOP film) the main plasmon peak was observed at 445 nanometers. However, there are other maxima that can be clearly discerned at shorter wavelengths, 254 and 295 nanometers. For Example 8 (TEMOP film) the main plasmon peak was observed at 455 nanometers with a much less pronounced secondary maximum at 284 nanometers. For Example 9 (MOP film) the main plasmon peak was observed at 437 nanometers and the low wavelength peaks are smeared as shoulders.

The invention claimed is:

1. An article comprising a microporous membrane and a discontinuous non-conductive coating of metallic nanoparticles directly thereon wherein the metallic nanoparticles comprise individual particles or agglomerates of particles having an average major dimension of 1 to 50 nm.

2. The article of claim 1 wherein said microporous membrane comprises a thermoplastic polymeric structure having a plurality of interconnected passageways to provide a network of communicating pores.

3. The article of claim 1 wherein said microporous membrane is stretched.

4. The article of claim 1 wherein said metallic nanoparticles are selected from gold, aluminum, copper, iron, platinum, palladium, iridium, rhodium, osmium, ruthenium, titanium, cobalt, vanadium, magnesium, silver, zinc, and cadmium, indium, lanthanum, indium, lanthanum, indium tin oxide (ITO) and antimony tin oxide (ATO), antimony indium tin oxide (AITO), tin, boron, lanthanum hexaboride, rare earth metals and mixtures and alloys thereof.

5. The article of claim 1 wherein the microporous membrane comprises 20 to 90 wt. % diluent.

6. The article of claim 1 wherein the microporous membrane comprises less than 10 wt. % diluent.

7. The article of claim 1, wherein said nanoparticles have an aspect ratio of greater than 1.5:1.

8. The article of claim 1 wherein the thermoplastic polymer of said microporous membrane is selected from polyamides, polyimides, polyurethanes, polyolefins, polystyrenes, polyesters, polycarbonates, polyketones, polyureas, polyacrylates, and polymethacrylates.

9. A multilayer article comprising at least one layer of the article of claim 1 and at least one additional layer.

10. The article of claim 1 wherein the maximum average thickness of said nanoparticle coating is less than 100 nm.

* * * * *

UNITED STATES PATENT AND TRADEMARK OFFICE
CERTIFICATE OF CORRECTION

PATENT NO. : 7,666,494 B2  Page 1 of 1
APPLICATION NO. : 11/121479
DATED : February 23, 2010
INVENTOR(S) : Don James McClure It is certified that error appears in the above-identified patent and that said Letters Patent is hereby corrected as shown below:

Title Page 2, Column 2,
Line 71, Under "Other Publications," delete "Rovve" and insert -- Rowe --.

Title Page 3, Column 2,
Line 7, Under "Other Publications," delete "Coating"." and insert -- Coating" (Attorney Docket No. 60590US002). --.

Column 2,
Line 33, delete "processible" and insert -- processable --.
Line 66, after "2" insert -- . --.
Line 67, after "3" insert -- . --.

Column 5,
Line 30, delete "Polymere," and insert -- Polymer, --.

Column 16,
Line 43, delete "indium, lanthanum, indium, lanthanum," and insert -- indium, lanthanum, --.

Signed and Sealed this

First Day of June, 2010

David J. Kappos
*Director of the United States Patent and Trademark Office*